(12) United States Patent
Deane

(10) Patent No.: US 9,030,461 B2
(45) Date of Patent: May 12, 2015

(54) LARGE AREA THIN FILM CIRCUITS EMPLOYING CURRENT DRIVEN, ILLUMINATION ENHANCED, DEVICES

(75) Inventor: Steven Charles Deane, Cambridge (GB)

(73) Assignee: Koninklijke Philips N.V., Eindhoven (NL)

( * ) Notice: Subject to any disclaimer, the term of this patent is extended or adjusted under 35 U.S.C. 154(b) by 1125 days.

(21) Appl. No.: 12/278,421

(22) PCT Filed: Jan. 31, 2007

(86) PCT No.: PCT/IB2007/050323
§ 371 (c)(1),
(2), (4) Date: Jan. 27, 2009

(87) PCT Pub. No.: WO2007/091191
PCT Pub. Date: Aug. 16, 2007

(65) Prior Publication Data
US 2009/0315877 A1    Dec. 24, 2009

(30) Foreign Application Priority Data

Feb. 10, 2006 (EP) .................................... 06101543

(51) Int. Cl.
*G01J 1/44* (2006.01)
*G09G 3/32* (2006.01)
*H03K 17/687* (2006.01)
(Continued)

(52) U.S. Cl.
CPC ............ *G09G 3/3233* (2013.01); *G09G 3/2011* (2013.01); *G09G 2300/0417* (2013.01); *G09G 2300/0819* (2013.01); *G09G 2320/0223* (2013.01); *G09G 2320/0233* (2013.01); *G09G 2320/0252* (2013.01); *G09G 2320/043* (2013.01); *G09G 2320/045* (2013.01);
(Continued)

(58) Field of Classification Search
USPC ......................................................... 345/214
See application file for complete search history.

(56) References Cited

U.S. PATENT DOCUMENTS

| 6,365,915 B1 | 4/2002 | Hirai et al. |
| 6,392,617 B1 | 5/2002 | Gleason |

(Continued)

FOREIGN PATENT DOCUMENTS

| EP | 1096466 A1 | 2/2001 |
| JP | 09090357 A | 4/1997 |

(Continued)

OTHER PUBLICATIONS

G. J. Papaioannou, et al: The Effect of Generation-Recombination Mechanisms on the Transient Behavior of Polycrystalline Silicon Transistors, Thin Solid Films, 487, 1-2, 2005, pp. 247-251.

(Continued)

*Primary Examiner* — Joseph Feild
*Assistant Examiner* — K. Kiyabu

(57) ABSTRACT

A thin film circuit comprises a plurality of thin film transistors, wherein the output response of the circuit is dependent on at least first (36) and second (34, 22) of the transistors. The first thin film transistor (36) is, in use, exposed to a source of illumination (2) and the second thin film transistor (16) is shielded from the source of illumination. The first thin film transistor (36) is operated in use as an analogue switch which provides an analogue output in response to a control input. The illumination of this transistor reduces the effect of dynamic threshold voltage variations, which can be a limitation to circuit performance.

11 Claims, 5 Drawing Sheets

(51) Int. Cl.
 *H03K 23/76* (2006.01)
 *G09G 3/20* (2006.01)
(52) U.S. Cl.
 CPC ........ *G09G2360/148* (2013.01); *H03K 17/687*
  (2013.01); *H03K 23/766* (2013.01)

(56) References Cited

U.S. PATENT DOCUMENTS

| | | | |
|---|---|---|---|
| 6,414,668 B1 * | 7/2002 | Karube et al. | 345/98 |
| 2001/0055008 A1 * | 12/2001 | Young et al. | 345/204 |
| 2002/0060756 A1 | 5/2002 | Kurashima | |
| 2002/0113760 A1 * | 8/2002 | Kimura | 345/82 |
| 2003/0142047 A1 * | 7/2003 | Inoue et al. | 345/82 |
| 2003/0179323 A1 * | 9/2003 | Abileah et al. | 349/24 |
| 2003/0189683 A1 | 10/2003 | Kurashina | |
| 2003/0214245 A1 * | 11/2003 | Yamazaki et al. | 315/169.3 |
| 2005/0168417 A1 | 8/2005 | Ha et al. | |
| 2006/0208979 A1 * | 9/2006 | Fish et al. | 345/81 |
| 2007/0139320 A1 * | 6/2007 | Deane et al. | 345/87 |
| 2007/0182674 A1 * | 8/2007 | Fish et al. | 345/76 |
| 2009/0015521 A1 | 1/2009 | Fish | |
| 2009/0128534 A1 * | 5/2009 | Fish et al. | 345/211 |

FOREIGN PATENT DOCUMENTS

| | | | |
|---|---|---|---|
| JP | 10209460 A * | 8/1998 | ............ H01L 29/786 |
| JP | 3591513 B2 | 11/2004 | |
| JP | 2005004097 A | 1/2005 | |
| JP | 2005076254 A | 3/2005 | |
| WO | 0120591 A1 | 3/2001 | |
| WO | 2004084168 A1 | 9/2004 | |
| WO | 2005004097 A1 | 1/2005 | |
| WO | 2005076254 A1 | 8/2005 | |

OTHER PUBLICATIONS

Written Opinion of the International Searching Authority, PCT2007/050323.

* cited by examiner

LARGE AREA THIN FILM CIRCUITS EMPLOYING CURRENT DRIVEN, ILLUMINATION ENHANCED, DEVICES

This invention relates to large area thin film electronic circuits. For example, the invention relates to amorphous silicon or polycrystalline silicon thin film circuits.

The operation of these thin film circuits is often critically dependent on the transistor threshold voltage. One issue with the performance of such circuits has been recognised to be the drift in threshold voltage of the transistors with age.

For circuits based on polysilicon, there are variations in the threshold voltage of the transistors due to the statistical distribution of the polysilicon grains in the channel of the transistors. Polysilicon transistors are, however, fairly stable under current and voltage stress, so that the threshold voltages remain substantially constant.

The variation in threshold voltage is small in amorphous silicon transistors, at least over short ranges over the substrate, but the threshold voltage is very sensitive to voltage stress. Application of the high voltages above threshold needed for the drive transistor causes large changes in threshold voltage, which changes are dependent on the information content of the displayed image. There will therefore be a large difference in the threshold voltage of an amorphous silicon transistor that is always on compared with one that is not. This differential ageing is a serious problem in LED displays driven with amorphous silicon transistors.

In addition to variations in transistor characteristics there is also differential ageing in the LED itself. This is due to a reduction in the efficiency of the light emitting material after current stressing. In most cases, the more current and charge passed through an LED, the lower the efficiency.

It has been recognised that a current-addressed pixel (rather than a voltage-addressed pixel) can reduce or eliminate the effect of transistor variations across the substrate. For example, a current-addressed pixel can use a current mirror to sample the gate-source voltage on a sampling transistor through which the desired pixel drive current is driven. The sampled gate-source voltage is used to address the drive transistor. This partly mitigates the problem of uniformity of devices, as the sampling transistor and drive transistor are adjacent each other over the substrate and can be more accurately matched to each other. Another current sampling circuit uses the same transistor for the sampling and driving, so that no transistor matching is required, although additional transistors and address lines are required.

Circuits have also been proposed for use as electroluminescent display pixel circuits which use optical feedback to provide compensation for the ageing of the LED, as well as to provide compensation for the threshold voltage variation of the main drive transistor.

Thus, various measures have been proposed which aim to compensate for the effect of ageing on the threshold voltage of thin film transistors.

Thin film transistors formed using amorphous silicon or polycrystalline silicon technology also suffer from a dynamic threshold voltage shift, and it has been recognised that this change in device characteristics is caused by the trapping and de-trapping of carriers at traps in the semiconductor. This is a short term effect which is evident when the bias conditions of the transistor are changed. The effect derives from defects in the semiconductor, which give rise to a temporary increase in threshold voltage. The filling of pre-existing traps by carriers removes them from the conduction channel, resulting in an increase in threshold voltage. This increase is reversed when the device is turned off, by the slow release of the carriers from the traps. Most of this trap filling process is completed in a time scale of microseconds to milliseconds.

The dynamic threshold voltage shift is not important for transistors operated digitally, namely switched hard ON or hard OFF. Many circuits are designed with the thin film transistors operating in this way. However, there is also an increasing interest to integrate analogue circuitry onto the substrate of an array of device elements formed from low temperature polysilicon or amorphous silicon.

The most common use of an array of electronic devices formed using thin film technology is for display devices. For liquid crystal display devices formed using low temperature polysilicon processing, it has for example been proposed to integrate the (analogue) buffer amplifiers onto the display substrate. For amorphous silicon electroluminescent display devices, the use of amorphous silicon thin film transistors operated in analogue manner has been proposed to form the pixel circuits. These are two only two of many examples where it has been recognised that the integration of thin film devices to form analogue circuits onto the substrate of an array of device elements is desired.

The dynamic threshold voltage shift results in the threshold voltage varying with bias history, temperature, and time. This makes accurate circuit operation very difficult to achieve. Even when a circuit includes a compensation circuit to compensate for threshold voltage drift through ageing, this dynamic threshold voltage shift can still influence circuit performance.

According to the invention, there is provided a thin film circuit, comprising a plurality of thin film transistors, wherein the output response of the circuit is dependent on at least first and second of the transistors, wherein the first thin film transistor is, in use, exposed to a source of illumination and the second thin film transistor is shielded from the source of illumination, and wherein the first thin film transistor is operated in use as an analogue device which provides an analogue output sensitive to the threshold voltage in response to a control input.

The first thin film transistor operates as an analogue switch. Thus, it is operated close to its threshold voltage, and the switch output toggles in response to the threshold voltage being reached. The switch is thus not operating as a phototransistor providing a charge flow in response to illumination, and is thus not for implementing an optical feedback function. The illumination of this transistor gives rise to increased leakage current, but this is tolerated as the (short term) response time for traps to be filled is reduced. This makes the threshold voltage settle to the longer term value more quickly, and makes the circuit response more predictable.

The second transistor may be a device sampling a voltage onto a capacitor, and so the increase in leakage current by illumination would not be acceptable. However, in this second transistor, operation may be digital, so the threshold voltage uncertainty is not an issue.

The transistor or transistors selected to be the illuminated ones will depend on the circuit function. The dynamic threshold voltage of some transistors will influence the overall circuit response whereas for others it will not.

The effect of the illumination is thus that the first transistor has shorter response time for the dynamic threshold voltage to reach an equilibrium threshold voltage and larger leakage current than the second transistor.

The invention can be applied to an active matrix display device comprising an array of display pixels, each pixel comprising the thin film circuit of the invention, in the form of:

a current-driven light emitting display element;

a drive transistor for driving a current through the display element; a storage capacitor for storing a voltage to be used for addressing the drive transistor;

an address transistor for switching a drive voltage to the remainder of the pixel;

a discharge transistor for discharging the storage capacitor thereby to switch off the drive transistor; and a light-dependent device for controlling the timing of the operation of the discharge transistor by varying the gate voltage applied to the discharge transistor in dependence on the light output of the display element, wherein the first transistor comprises the discharge transistor and the second transistor comprises the address transistor.

The discharge transistor is thus illuminated to speed up the response time, as the timing at which discharge takes place dictates the compensation circuit performance, and this is dependent on the threshold voltage of the discharge transistor. The drift of this threshold voltage over time is very small, as the transistor can be operated with low duty cycle, so that it is the effect of the dynamic threshold voltage that can become a limitation to the circuit performance.

The drive transistor and the discharge transistor may comprise low temperature polysilicon transistors or amorphous silicon transistors. The light emitting display element can provide the source of illumination.

The invention can also be applied to an active matrix liquid crystal display device comprising an array of display pixels and drive circuitry, the driver circuitry comprising the thin film circuit of the invention, and the device further comprises a backlight providing the source of illumination.

Thus, driver circuitry rather than pixel circuitry can also benefit from the approach of this invention.

In this case, the drive circuitry may comprise column driver circuitry having digital to analogue circuitry and an array of output buffers, wherein the first transistor comprises a transistor of the output buffers.

The invention also provides a method of controlling a thin film circuit comprising a plurality of thin film transistors, wherein the output response of the circuit is dependent on at least first and second of the transistors, the method comprising:

exposing the first thin film transistor to a source of illumination; and shielding the second thin film transistor from the source of illumination; and operating the first thin film transistor as an analogue device which provides an analogue output sensitive to the threshold voltage in response to a control input.

The invention will now be described by way of example with reference to the accompanying drawings, in which.

Figure 1:
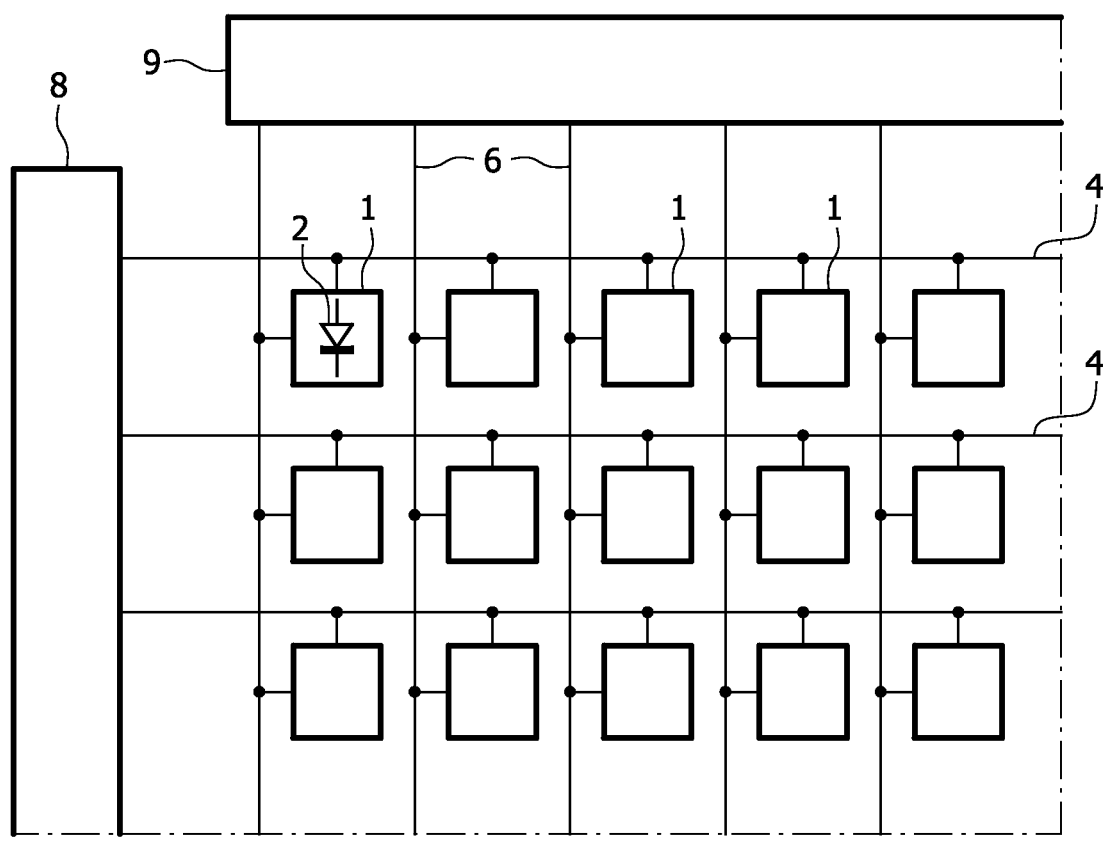
FIG. 1 shows a known EL display device.

It should be noted that these figures are diagrammatic and not drawn to scale. Relative dimensions and proportions of parts of these figures have been shown exaggerated or reduced in size, for the sake of clarity and convenience in the drawings.

The invention relates generally to the use of thin film circuit devices, particularly thin film transistors, in an analogue mode of operation.

The invention will be explained with reference to a first example of application of the invention, relating to the thin film transistor pixel circuits of an active matrix electroluminescent display device.

Matrix display devices employing electroluminescent, light-emitting, display elements are well known. The display elements may comprise organic thin film electroluminescent elements, for example using polymer materials, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer.

The polymer material can be fabricated using a CVD process, or simply by a spin coating technique using a solution of a soluble conjugated polymer. Ink-jet printing may also be used. Organic electroluminescent materials can be arranged to exhibit diode-like I-V properties, so that they are capable of providing both a display function and a switching function, and can therefore be used in passive type displays. Alternatively, these materials may be used for active matrix display devices, with each pixel comprising a display element and a switching device for controlling the current through the display element.

Display devices of this type have current-addressed display elements, so that a conventional, analogue drive scheme involves supplying a controllable current to the display element. It well is known to provide a current source transistor as part of the pixel configuration, with the gate voltage supplied to the current source transistor determining the current through the display element. A storage capacitor holds the gate voltage after the addressing phase.

FIG. 1 shows a known active matrix addressed electroluminescent display device. The display device comprises a panel having a row and column matrix array of regularly-spaced pixels, denoted by the blocks 1 and comprising electroluminescent display elements 2 together with associated switching means, located at the intersections between crossing sets of row (selection) and column (data) address conductors 4 and 6. Only a few pixels are shown in the Figure for simplicity. In practice there may be several hundred rows and columns of pixels. The pixels 1 are addressed via the sets of row and column address conductors by a peripheral drive circuit comprising a row, scanning, driver circuit 8 and a column, data, driver circuit 9 connected to the ends of the respective sets of conductors.

The electroluminescent display element 2 comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support. Either the cathodes or the anodes of the display elements are formed of transparent conductive material. The support is of transparent material such as glass and the electrodes of the display elements 2 closest to the substrate may consist of a transparent conductive material such as ITO so that light generated by the electroluminescent layer is transmitted through these electrodes and the support so as to be visible to a viewer at the other side of the support.

Figure 2:
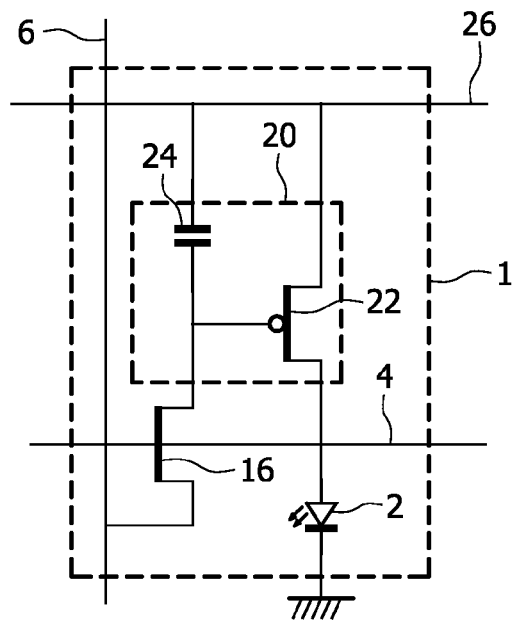
FIG. 2 is a simplified schematic diagram of a known pixel circuit for current-addressing the EL display pixel.

FIG. 2 shows in simplified schematic form a first known pixel and drive circuitry arrangement for providing voltage-addressed operation. Each pixel 1 comprises the EL display element 2 and associated driver circuitry. The driver circuitry has an address transistor 16 which is turned on by a row address pulse on the row conductor 4. When the address transistor 16 is turned on, a voltage on the column conductor 6 can pass to the remainder of the pixel. In particular, the address transistor 16 supplies the column conductor voltage to a current source 20, which comprises a drive transistor 22 and a storage capacitor 24. The column voltage is provided to the gate of the drive transistor 22, and the gate is held at this voltage by the storage capacitor 24 even after the row address pulse has ended.

The drive transistor 22 in this circuit is implemented as a p-type TFT, so that the storage capacitor 24 holds the gate-source voltage fixed. This results in a fixed source-drain current through the transistor, which therefore provides the desired current source operation of the pixel.

As mentioned above, variations in transistor characteristics limit the lifetime of the circuit. There is also differential ageing in the LED itself, due to a reduction in the efficiency of the light emitting material after current stressing. In most cases, the more current and charge passed through an LED, the lower the efficiency.

It has been recognised that a current-addressed pixel (rather than a voltage-addressed pixel) can reduce or eliminate the effect of transistor variations across the substrate. For example, a current-addressed pixel can use a current mirror to sample the gate-source voltage on a sampling transistor through which the desired pixel drive current is driven. The sampled gate-source voltage is used to address the drive transistor. This partly mitigates the problem of uniformity of devices, as the sampling transistor and drive transistor are adjacent each other over the substrate and can be more accurately matched to each other. Another current sampling circuit uses the same transistor for the sampling and driving, so that no transistor matching is required, although additional transistors and address lines are required.

There have also been proposals for voltage-addressed pixel circuits which compensate for the aging of the LED material. For example, various pixel circuits have been proposed in which the pixels include a light sensing element. This element is responsive to the light output of the display element and acts to leak stored charge on the storage capacitor in response to the light output, so as to control the integrated light output of the display during the address period.

Figure 3:
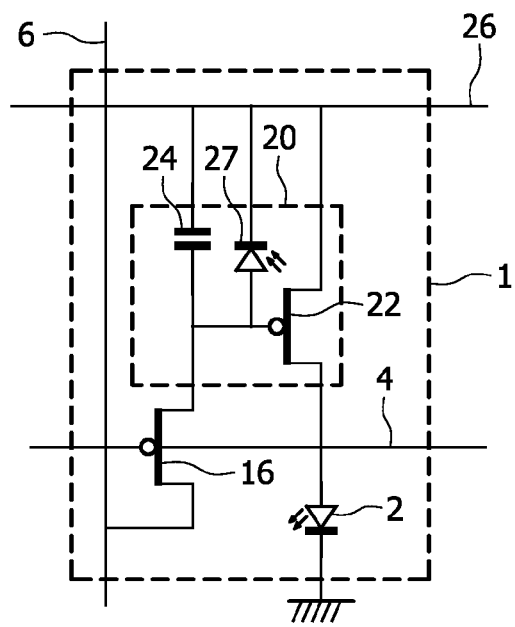
FIG. 3 shows a known pixel design which compensates for differential aging.

FIG. 3 shows one example of pixel layout for this purpose. Examples of this type of pixel configuration are described in detail in WO 01/20591 and EP 1 096 466.

In the pixel circuit of FIG. 3, a photodiode 27 discharges the gate voltage stored on the capacitor 24. The EL display element 2 will no longer emit when the gate voltage on the drive transistor 22 reaches the threshold voltage, and the storage capacitor 24 will then stop discharging. The rate at which charge is leaked from the photodiode 27 is a function of the display element output, so that the photodiode 27 functions as a light-sensitive feedback device. It can be shown that the integrated light output, taking into the account the effect of the photodiode 27, is given by:

$$L_T = \frac{C_S}{\eta_{PD}}(V(0) - V_T) \quad [1]$$

In this equation, $\eta_{PD}$ is the efficiency of the photodiode, which is very uniform across the display, $C_s$ is the storage capacitance, $V(0)$ is the initial gate-source voltage of the drive transistor and $V_T$ is the threshold voltage of the drive transistor. The light output is therefore independent of the EL display element efficiency and thereby provides aging compensation. However, $V_T$ varies across the display so it will exhibit non-uniformity.

Figure 4:
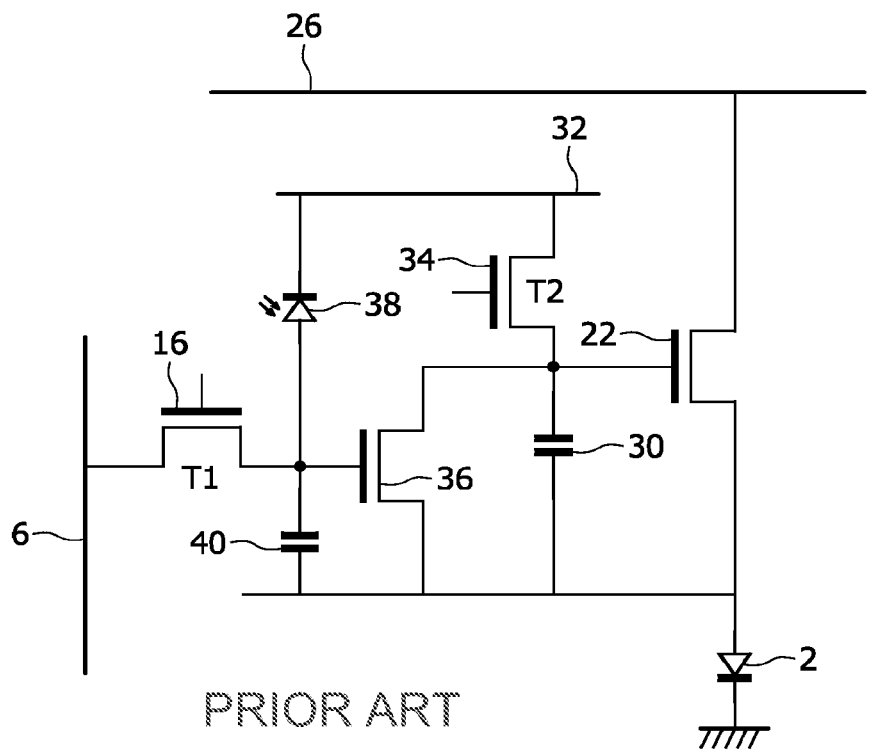
FIG. 4 shows an improved known pixel circuit and which is used to explain examples of the method of the invention.

In order to additionally compensate for the stress induced threshold voltage variations of an amorphous silicon drive transistor, and to avoid the gradual drop of in drive current in this circuit, the circuit of FIG. 4 has been proposed by the applicant.

FIG. 4 shows an example of this proposed pixel layout, and shown for implementation using amorphous silicon n-type transistors.

The gate-source voltage for the drive transistor 22 is again held on a storage capacitor 30. However, this capacitor is charged to a fixed voltage from a charging line 32, by means of a charging transistor 34 (T2). Thus, the drive transistor 22 is driven to a constant level which is independent of the data input to the pixel when the display element is to be illuminated. The brightness is controlled by varying the duty cycle, in particular by varying the time when the drive transistor is turned off.

The drive transistor 22 is turned off by means of a discharge transistor 36 which discharges the storage capacitor 30. When the discharge transistor 36 is turned on, the capacitor 30 is rapidly discharged and the drive transistor turned off.

The discharge transistor is turned on when the gate voltage reaches a sufficient voltage. A photodiode 38 is illuminated by the display element 2 and generates a photocurrent in dependence on the light output of the display element 2. This photocurrent charges a discharge capacitor 40, and at a certain point in time, the voltage across the capacitor 40 will reach the threshold voltage of the discharge transistor and thereby switch it on. This time will depend on the charge originally stored on the capacitor 40 and on the photocurrent, which in turn depends on the light output of the display element.

The photodiode may equally be implemented as a phototransistor connected between the gate of the discharge transistor 36 and the charging line 32, and with the gate controlled by the address line for the previous row (i.e. the control line associated with the address transistor 16 of the previous row). The photodiode or phototransistor is located under the LED 2

The data signal provided to the pixel on the data line 6 is supplied by the address transistor 16 (T1) and is stored on the discharge capacitor 40. A low brightness is represented by a high data signal (so that only a small amount of additional charge is needed for the transistor 36 to switch off) and a high brightness is represented by a low data signal (so that a large amount of additional charge is needed for the transistor 36 to switch off).

This circuit thus has optical feedback for compensating ageing of the display element, and also has threshold compensation of the drive transistor 22, because variations in the drive transistor characteristics will also result in differences in the display element output, which are again compensated by the optical feedback. For the transistor 36, the gate voltage over threshold is kept very small, so that the threshold voltage variation is much less significant.

This circuit and the associated timing is explained in greater detail in WO 2004/084168. Modifications to the circuit are also shown in this publication.

The addressing transistor 16, which is used to address a data value into the pixel to be stored on the capacitor 40, must have a low leakage current to avoid vertical cross talk. However, its threshold voltage does not critically influence circuit operation.

The circuit compensates for the drift in threshold voltage of the drive transistor and the ageing of the OLED, but any drift in the threshold voltage of the snap-off transistor 36 can still influence the display output and/or the time over which the feedback compensation remains functional. The drift in the threshold voltage through ageing is small (even for an amorphous silicon transistor), as the transistor is operated with low duty cycle.

The previous proposed implementation of the circuit of FIG. 4 has the discharge transistor 36 shielded from light, as it is not performing any optical feedback function.

While the circuit of FIG. 4 performs well, a limitation to the performance of the circuit results from the dynamic nature of the threshold voltage of the discharge transistor 36.

The maximum time constant required to reach an equilibrium threshold voltage Vth in a TFT after turn on is given by:

$$t = \frac{1}{v}\exp\left(\frac{qE_g}{2kT}\right) \quad [2]$$

Where t is the time taken to achieve equilibrium, v is the typical electron attempt frequency, q is the electronic charge, $E_g$ is the semiconductor bandgap, k is Boltzmann's constant, and T is the absolute temperature.

Substituting typical values for amorphous silicon (v=1e13 Hz, $E_g$=1.8 eV, T=300K), this gives a response time of t=134 s (although a state close to the equilibrium will be reached much more quickly as the curve is logarithmic). Similarly for low temperature polysilicon ($E_g$=1.1 eV) t=175 µs.

These time constants can be compared with typical frame times (16.6 ms) or line times (10-50 µs), and this shows that there are significant potential issues.

The invention is based on the recognition that this problem may be overcome by locating specific TFTs in such a way that they are illuminated. This results in electron-hole pair generation in the semiconductor, and results in a much faster equilibrium process. The speeding up of the equilibration process is proportional to the photocurrent, so the effect can be tuned for various applications.

It can be shown that the time for traps to reach equilibrium in this case is:

$$t_2 = \frac{1}{v}\exp\left(\frac{qE_{fn}}{kT}\right) \quad [3]$$

Where $E_{fn}$ is the electron quasi-Fermi level, which can be defined in terms of the free carrier concentration, $n_f$, and the effective density of states, $N_c$, as:

$$E_{fn} = \frac{kT}{q}\ln\left(\frac{N_c}{n_f}\right) \quad [4]$$

These equations may be combined to give:

$$t_2 = \frac{N_c}{v \cdot n_f} \quad [5]$$

This time value can be seen to be temperature independent. The time to reach equilibrium has been reduced by the ratio of the photocurrent to the dark current of a perfect TFT (which is many orders of magnitude lower than that achieved in actual TFTs).

This illumination gives rise to increased leakage current, and the invention thus provides a compromise between the leakage current of some TFTs, and the stability of their threshold voltage.

For free carrier levels which correspond to a photocurrent of approximately 100 pA in an amorphous silicon TFT, which is small enough not to unduly disturb circuit operation, the illuminated equilibration time can be estimated as approximately 5 µs, which is over 7 orders of magnitude faster than the non-illuminated case outlined above.

Figure 5:
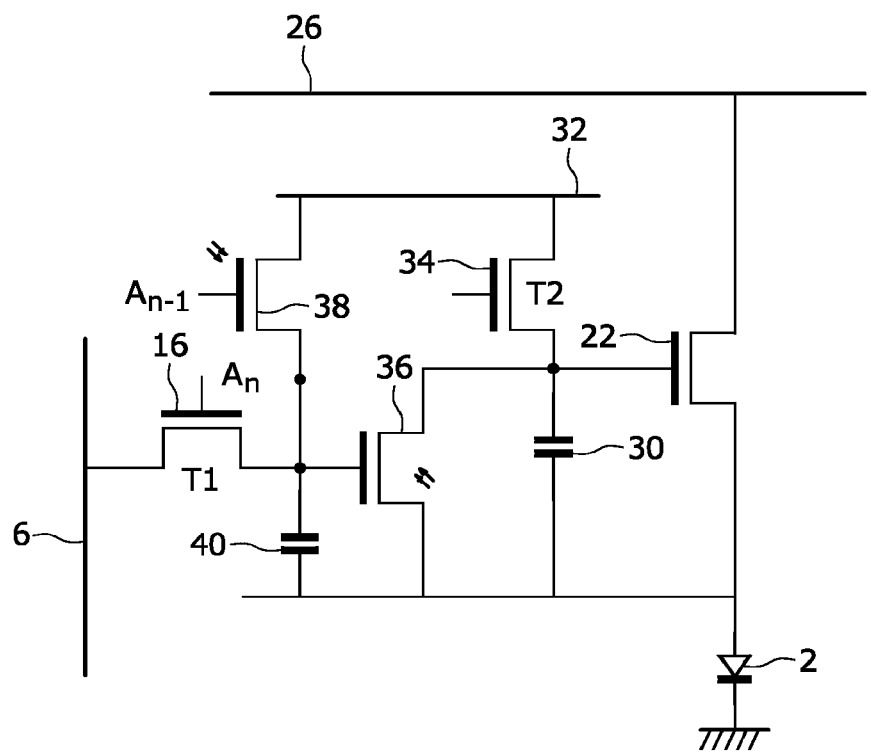
FIG. 5 shows how the invention is applied to the pixel circuit of FIG. 4.

The implementation of the invention as explained above to the circuit of FIG. 4 provides the discharge transistor 36 under the LED. This is illustrated in the circuit of FIG. 5, which shows the illumination of the discharge transistor 36, and for completeness also shows the use of a phototransistor as the optical feedback element 38.

This means that the discharge transistor exhibits a well-defined threshold voltage on the timescales of interest for circuit operation. The leakage current increase is sufficiently low not to degrade the other aspects of the circuit operation, and with appropriate component sizing, this can even give an improvement to the correction capability of the circuit. This can occur because a pixel with a high efficiency display element will experience more leakage in the discharge transistor, reducing the bias on the gate of the drive transistor, and so reducing the brightness of the pixel.

This provides a form of pre-correction, which leaves less variation for the main part of the circuit to correct, resulting in a better correction capability, and so longer display lifetime.

The invention can also be applied to driver circuits for display devices, rather than the pixel circuits. In low temperature polysilicon devices in which the driver circuits are to be integrated onto the pixel array substrate (so-called "system-on-panel"), a key issue is to make accurate analogue components, such as buffer amplifiers.

Similar issues apply as explained above, and again critical TFTs can be illuminated by the backlight. This can be achieved by locating these TFTs near the display edge avoiding any light shielding, again ensuring that they equilibrate more rapidly.

With correct circuit design, the increased photoleakage current does not degrade the performance. The high accuracy is only required in high quality video modes, which generally use the backlight, and therefore already have available the required source of illumination.

Figure 6:
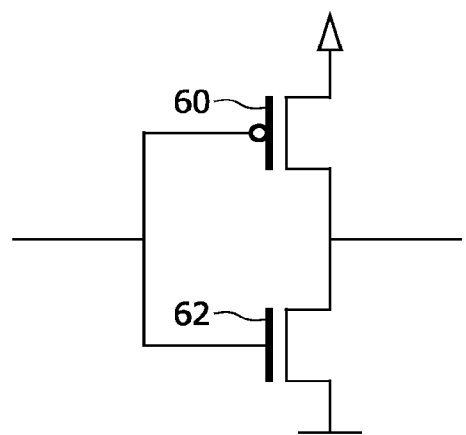
FIG. 6 shows an output buffer for a column driver circuit to which the invention can be applied.

By way of simplified example, FIG. 6 shows an output stage of an analogue buffer amplifier, in the form of a push-pull stage having a p-type pull up transistor 60 and an n-type pull down transistor 62. These transistors operate in analogue mode, and settle with an output voltage which results from the equalisation of the analogue source-drain currents of the two transistors.

In the manner explained above, the correct operation of this output stage may be critical to the performance of the driver circuit, and it may also be influenced by the dynamic threshold voltage transients explained above.

Figure 7:
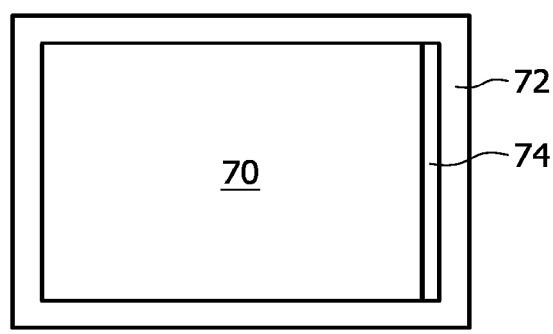
FIG. 7 shows a display device layout of the invention.

FIG. 7 shows how selected parts of the driver circuitry can be illuminated. The pixel area is shown as 70. The outer border of the pixel area is shielded by a metal layer within the structure, shown as 72, and this provides a good quality black border to the image area. Transistors that are to be illuminated can be located within the non-shielded area, between the outer edge of the pixel area and the metal layer shield, in the area shown as 74.

Figure 8:
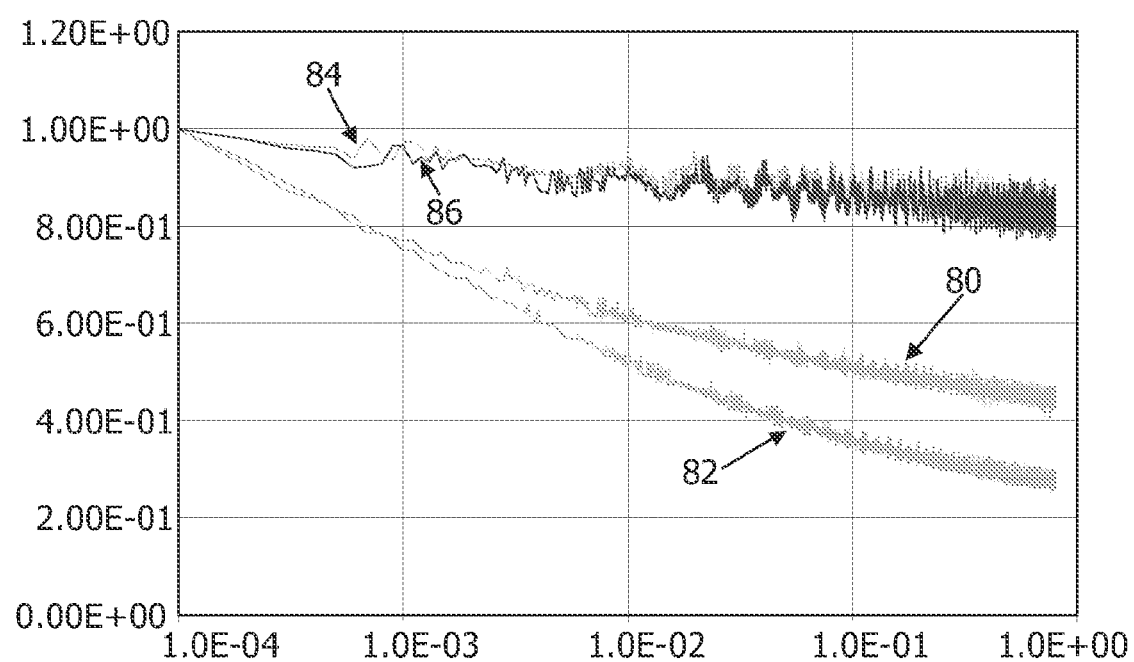
FIG. 8 is a graph to show the effect of the invention on transistor characteristics.

FIG. 8 is used to show how the illumination affects the TFT performance. The graph shows the current flow through a TFT which has a gate voltage applied which is just below the threshold voltage. This represents operation of the transistor at the steepest point of the I-V curve, which makes the current decay (resulting from dynamic threshold voltage drift) most evident.

Plot 80 shows the response of a transistor in the dark at 40 degrees Celsius. Plot 82 shows the response of a transistor in the dark and at 30 degrees Celsius. Plot 84 shows the response of an illuminated transistor at 40 degrees Celsius, and Plot 86 shows the response of an illuminated transistor at 30 degrees Celsius. The plots are all normalised to have the same starting current. The x-axis is time in seconds.

The gate signal is a pulse to 2V (based on a threshold voltage of approximately 2.5V), and FIG. 8 is modelled on a TFT with width 600 microns and length 6 microns.

The graph shows that illumination makes the transistor response flatter and also less temperature dependent. This means the circuit performance is less dependent on prior history as well as temperature.

The more detailed example above for an electroluminescent display pixel circuit provides significant improvement to circuit performance, and can assist in making large TV displays using amorphous silicon a practical proposition. However, the underlying technique of the invention may also assist in many different applications using integration of analogue TFTs, whether LTPS or amorphous silicon.

Essentially, the invention can be applied to any analogue thin film transistor circuit, and provides illumination of selected transistors for which an increase in leakage current but reduced time constant for the dynamic threshold voltage gives improved circuit performance. For other transistors, a lower leakage current is more important, and these are not illuminated.

The illuminated transistors function as switching devices, and not as light sensors. The function implemented by the illuminated transistor is thus advantageous independent of the light level, and the illumination is thus for altering the transistor characteristics rather than providing a control parameter for the timing of switching of another transistor or for providing a measurable charge flow which corresponds to the illumination level. A phototransistor is typically designed to have a current flow proportional to the illumination, but this is not a requirement of the TFTs which are illuminated by the approach of this invention. The full circuit of which the illuminated transistor forms a component may have a light dependent function (as in the optical feedback pixel circuit above). However, the analogue driven transistor which is illuminated in the manner of the invention does not implement any optical sensing or feedback function.

The illuminated transistors provide an analogue output that is sensitive to the threshold voltage Various other modifications will be apparent to those skilled in the art.

The invention claimed is:

1. A thin film circuit, comprising:
a plurality of thin film transistors,
wherein an output response of the thin film circuit is dependent on at least a first one and a second one of the plurality of thin film transistors,
wherein the first thin film transistor is positioned below a source of illumination, said first thin film transistor discharging a storage capacitor;
wherein the second thin film transistor is shielded from the source of illumination by being positioned in a shielded outside perimeter area surrounding an area of illumination of said source of illumination and switching a drive voltage; and
said first thin film transistor is positioned in an area along an inner edge of the shielded outside perimeter area within said area of illumination, the first thin film transistor being operated as an analogue device which provides an analogue output sensitive to a threshold voltage in response to a control input.

2. The circuit as claimed in claim 1, wherein the first thin film transistor has shorter response time for a dynamic threshold voltage to reach an equilibrium threshold voltage and larger leakage current than the second thin film transistor.

3. An active matrix display device comprising an array of display pixels, each pixel comprising a thin film circuit, the thin film circuit comprising:
a current-driven light emitting display element;
a drive transistor for driving a current through the current-driven light emitting display element;
a storage capacitor for storing a voltage to be used for addressing the drive transistor;
an address transistor for switching a drive voltage to the remainder of the pixel;
a discharge transistor for discharging the storage capacitor thereby to switch off the drive transistor; and
a light-dependent device for controlling timing of the operation of the discharge transistor by varying a gate voltage applied to the discharge transistor in dependence on a light output of the current-driven light emitting display element,
wherein the address transistor is shielded from a source of illumination of the current-driven light emitting display element by being positioned in an area surrounding an area of illumination of the current-driven light emitting display element, and the discharge transistor is positioned under the current driven light emitting element in an area along an inner edge of the shielded surrounding area within the area of illumination of the current-driven light emitting display element.

4. The device as claimed in claim 3, wherein the drive transistor and the discharge transistor comprise low temperature polysilicon transistors.

5. The device as claimed in claim 3, wherein the drive transistor and the discharge transistor comprise amorphous silicon transistors.

6. The device as claimed in claim 3, wherein the current-driven light emitting display element provides the source of illumination.

7. An active matrix liquid crystal display device comprising:
an array of display pixels and drive circuitry
wherein the drive circuitry comprises a thin film circuit comprising:

a plurality of thin film transistors,
  wherein the output response of the thin film circuit is dependent on at least a first one and a second one of the plurality of thin film transistors,
  wherein the second thin film transistor switches a drive voltage and is shielded from a source of illumination by being positioned in a shielded outside perimeter area surrounding an area of illumination of the source of illumination, and the first thin film transistor discharges a storage capacitor to switch off a drive transistor, said first thin film transistor being positioned below the source of illumination and positioned in an area along an inner edge of the shielded outside perimeter area within the area of illumination, the first thin film transistor being operated as an analogue device which provides an analogue output sensitive to a threshold voltage in response to a control input; and
a backlight providing the source of illumination.

8. The device as claimed in claim 7, wherein the drive circuitry further comprises:
  column driver circuitry having digital to analogue circuitry and an array of output buffers, wherein the first thin film transistor comprises a transistor of the output buffers.

9. The device as claimed in claim 8, wherein each output buffer comprises first and second opposite type transistors in series between power lines.

10. A method of controlling a thin film circuit comprising a plurality of thin film transistors, wherein the output response of the circuit is dependent on at least a first one and a second one of the plurality of thin film transistors, said first thin film transistor discharging a stored voltage and said second thin film transistor switching a drive voltage, the method comprising:
  shielding the second thin film transistor from a source of illumination, said second thin film transistor being positioned in a shielded outside perimeter area surrounding an area of illumination of said source of illumination;
  exposing the first thin film transistor to the source of illumination, wherein said first thin film transistor is positioned below the source of illumination and in an area along an inner edge of the shielded output perimeter area within said area of illumination; and
  operating the first thin film transistor as an analogue device which provides an analogue output sensitive to a threshold voltage in response to a control input.

11. The method as claimed in claim 10, wherein the first thin film transistor is controlled by the illumination of the source of illumination to have a shorter response time for a dynamic threshold voltage to reach an equilibrium threshold voltage and larger leakage current than the second thin film transistor.

* * * * *